(12) United States Patent
Hars

(10) Patent No.: US 7,124,155 B2
(45) Date of Patent: Oct. 17, 2006

(54) LATCHING ELECTRONIC CIRCUIT FOR RANDOM NUMBER GENERATION

(75) Inventor: Laszlo Hars, Cortlandt Manor, NY (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 949 days.

(21) Appl. No.: 10/205,231

(22) Filed: Jul. 25, 2002

(65) Prior Publication Data
US 2004/0019617 A1 Jan. 29, 2004

(51) Int. Cl.
G06F 7/58 (2006.01)
(52) U.S. Cl. .................................. 708/250
(58) Field of Classification Search ......... 708/250–256
See application file for complete search history.

(56) References Cited

U.S. PATENT DOCUMENTS

| 4,571,556 A | 2/1986 | Gnerlich et al. |
|---|---|---|
| 5,153,532 A | 10/1992 | Albers et al. |
| 5,570,307 A | 10/1996 | Takahashi |
| 5,596,617 A | 1/1997 | Wolf et al. |
| 5,606,322 A | 2/1997 | Allen et al. |
| 5,942,902 A | 8/1999 | Okayasu |
| 6,046,616 A | 4/2000 | Chan et al. |
| 6,324,558 B1 | 11/2001 | Wilber |
| 6,714,955 B1 * | 3/2004 | Le Quere ............. 708/250 |
| 2001/0005155 A1 | 6/2001 | Smeets |
| 2002/0124033 A1 * | 9/2002 | Takahashi ............. 708/250 |

FOREIGN PATENT DOCUMENTS

| EP | 0 981 081 A2 | 2/2000 |
|---|---|---|
| EP | 1 075 084 A2 | 2/2001 |
| WO | WO 99/38069 | 7/1999 |
| WO | WO 01/61854 A1 | 8/2001 |

OTHER PUBLICATIONS

By Kinnement D J; Chester E. G: "Design of an on-Chip Random Number Generator Using Metastability" ESSCIRC 2002 Proceedings on the 28th European Solid-State Circuit Conference Sep. 24-26, 2002, pp. 595-598, Firenze, Italy.

Belido M J et al: "A Simple Binary Random Number Generator: New Approaches for CMOS VLSI" Circuits and Systems, 1992., Proceeding of the 35th Midwest Symposium on Washington, DC, USA Aug. 9-12, 1992, New York, NY, USA, IEEE, US.

By Walker S et al: "Evaluating Metastability in Electronic Circuits for Random Number Generation" IEEE Computer Society Workshop VLSI 2001, Aug. 19-20, 2001, pp. 99-101.

* cited by examiner

Primary Examiner—D. H. Malzahn
(74) Attorney, Agent, or Firm—Kevin Fortin

(57) ABSTRACT

A physical random number generator has a bi-stable latch that operates to generate a random number bit in response to a reception of one or more voltage input signals and a clock signal. A voltage source provides the voltage input signal(s) for provoking the bi-stable latch into a metastable state. A clock provides the clock signal for triggering the bi-stable latch. When triggered, the bi-stable latch latches the random number bit as a function of its metastable state provoked by the voltage input signal(s).

8 Claims, 4 Drawing Sheets

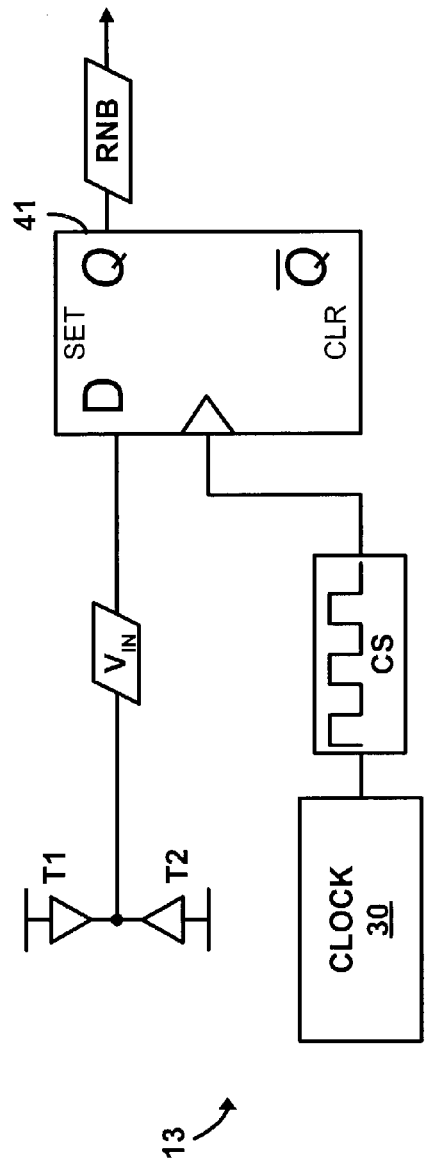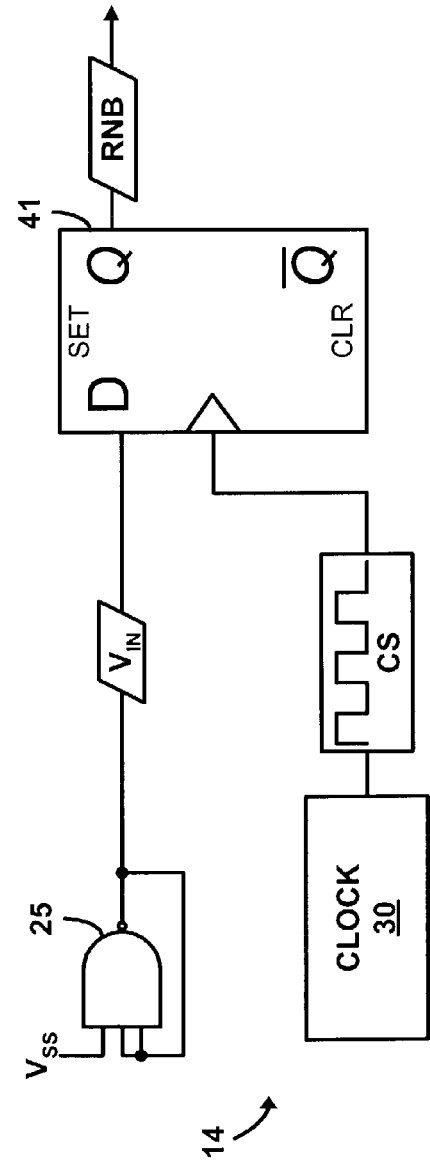

LATCHING ELECTRONIC CIRCUIT FOR RANDOM NUMBER GENERATION

TECHNICAL FIELD

The present invention generally relates to physical random number generators (i.e., a device that generates a bit or bits representative of a number by operating one or more components of the device in an undeterminable manner). The present invention specifically relates to an operational efficiency of a physical random number generator that facilitates an incorporation of the physical random number generator within various types of electronic devices.

BACKGROUND AND SUMMARY OF THE INVENTION

FIG. 1 illustrates one possible way to provoke a metastable state of a bi-stable latch via one or more inputs to the bi-stable latch. When a voltage level of each input of the bi-stable latch equals or exceeds a high logic voltage level $V_{HL}$, each output of the bi-stable latch can be pre-determined with a high degree of certainty (i.e., a stable state). Similarly, when a voltage level of each input of the bi-stable latch equals or is lower than a low logic voltage level $V_{LL}$, each output of the bi-stable latch can again be pre-determined with a high degree of certainty. Conversely, when a voltage level of any input of the bi-stable latch is between the high logic voltage level $V_{HL}$ and the low logic voltage level $V_{LL}$ (i.e., an indeterminate range), each output of the bi-stable latch can't be pre-determined with any degree of certainty (i.e., the metastable state).

The present invention provokes a metastable state of a bi-stable latch as a basis of a physical random number generator. Various aspects of the present invention are novel, non-obvious, and provide various advantages. While the actual nature of the present invention covered herein can only be determined with reference to the claims appended hereto, certain features, which are characteristic of the embodiments disclosed herein, are described briefly as follows.

One form of the present invention is a physical random number generator comprising a voltage source, a clock, and a bi-stable latch. The voltage source operates to provide one or more voltage input signals for provoking the bi-stable latch into a metastable state. The clock operates to provide a clock signal for triggering the bi-stable latch. The bi-stable latch operates to latch a random number bit in response to a triggering of the bi-stable latch by the clock signal, the random number bit being a function of a provoking of the bi-stable latch into the metastable state by the voltage input signal(s).

The foregoing form as well as other forms, features and advantages of the present invention will become further apparent from the following detailed description of the presently preferred embodiments, read in conjunction with the accompanying drawings. The detailed description and drawings are merely illustrative of the present invention rather than limiting, the scope of the present invention being defined by the appended claims and equivalents thereof.

BRIEF DESCRIPTION OF THE DRAWINGS

FIG. 5 illustrates a schematic diagram of a third embodiment of a physical random number generator in accordance with the present invention;

FIG. 6 illustrates a schematic diagram of a fourth embodiment of a physical random number generator in accordance with the present invention.

DETAILED DESCRIPTION OF THE PRESENT INVENTION

Figure 2:
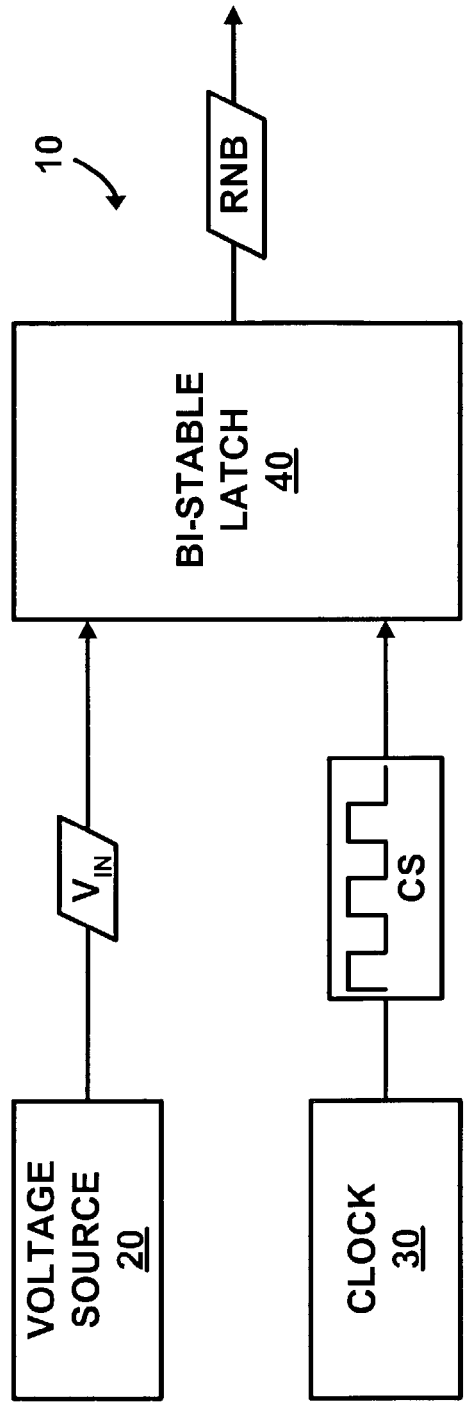
FIG. 2 illustrates a block diagram of a basic embodiment of a physical random number generator in accordance with the present invention.

FIG. 2 illustrates a physical random number generator 10 (hereinafter "PRNG 10") comprising a conventional voltage source 20, a conventional clock 30, and a conventional bi-stable latch 40. The voltage source 20 provides a voltage input signal $V_{IN}$ having a logic voltage level for provoking the bi-stable latch 40 into a metastable state. The clock 30 provides a clock signal CS for triggering the bi-stable latch 40 (e.g., an edge triggering or a level triggering). Upon each triggering of the bi-stable latch 40 by the clock signal CS, the bi-stable latch 40 latches a random number bit RNB as a function of its metastable state provoked by the voltage input signal $V_{IN}$ provided by the voltage source 20. Alternatively, when triggered, the bi-stable latch 40 can latch the random number bit RNB as a function of its metastable state being provoked by a plurality of voltage input signals $V_{IN}$ provided by the voltage source 20.

Figure 1:
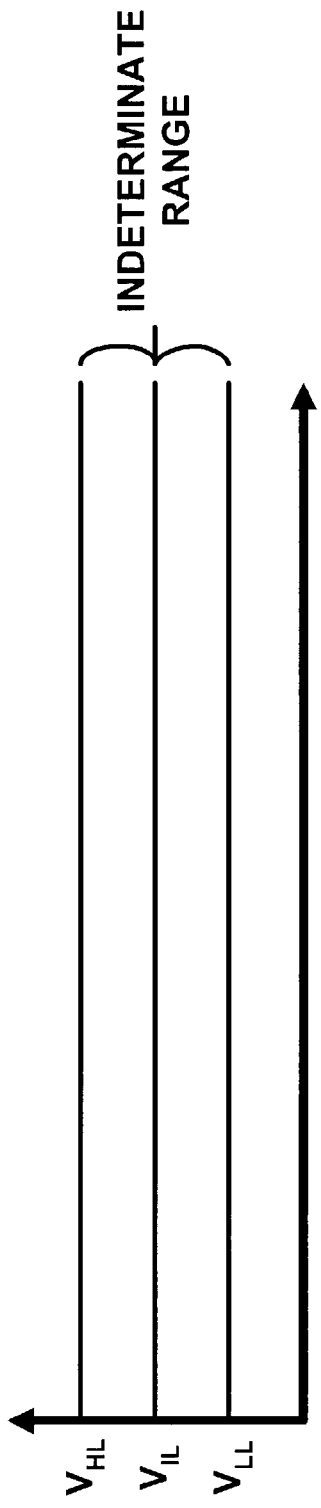
FIG. 1 illustrates a graphic view of a data voltage range for provoking a metastable state of a bi-stable latch.

The randomness of a logic voltage level of the random number bit RNB as a zero (e.g., a low logic voltage level $V_{LL}$ as shown in FIG. 1) or a one (e.g., a high logic voltage level $V_{HL}$ as shown in FIG. 1) is based on the internal noise of the bi-stable latch 40 (e.g., thermal-junction-, shot- or other types of noise as well known in the art). This kind of metastable behavior by the bi-stable latch 40 is provoked by the voltage input signal $V_{IN}$ having a logic voltage level within an indeterminate range of the bi-stable latch 40, such as, for example, an indeterminate logic voltage level $V_{IL}$ as shown in FIG. 1. Preferably, the logic voltage level of the voltage input signal $V_{IN}$ is around a median of the indeterminate range of the bi-stable latch 40. When the bi-stable latch 40 is triggered, the metastable state of the bi-stable latch 40 functions to latch the random number bit RNB with a logic voltage level reflective of whether the logic voltage level of the voltage input signal $V_{IN}$ is considered by the bi-stable latch 40 to equate to the low logic voltage level $V_{LL}$ or to the high logic voltage level $V_{HL}$.

The number of configurations of the voltage source 20, the clock 30 and the bi-stable latch 40 in accordance with the present invention is without limit. Additionally, a communication of the voltage input signal $V_{IN}$ by the voltage source 20 to the bi-stable latch 40 and a communication of the clock signal CS by the clock 30 to the bi-stable latch 40 can be achieved in numerous ways (e.g., electrically, optically, acoustically, and/or magnetically). The number of embodiments of the PRNG 10 in accordance with the present invention is therefore essentially limitless.

The following description herein of four embodiments of PRNG 10 as illustrated in FIGS. 3–6 are premised on an operational specification directed to a common temperature dependence of the voltage source 20 and the bi-stable latch 40. Such common temperature dependence can be best achieved by employing standard library cells of the voltage source 20 and the bi-stable latch 40 on the same chip. Furthermore, short electrical coupling between the voltage source 20 and the bi-stable latch 40 prevents non-random signals to influence the random behavior of the bi-stable latch 40. The short electrical coupling can also be achieved by employing the voltage source 20 and the bi-stable latch 40 on the same chip.

Figure 3:
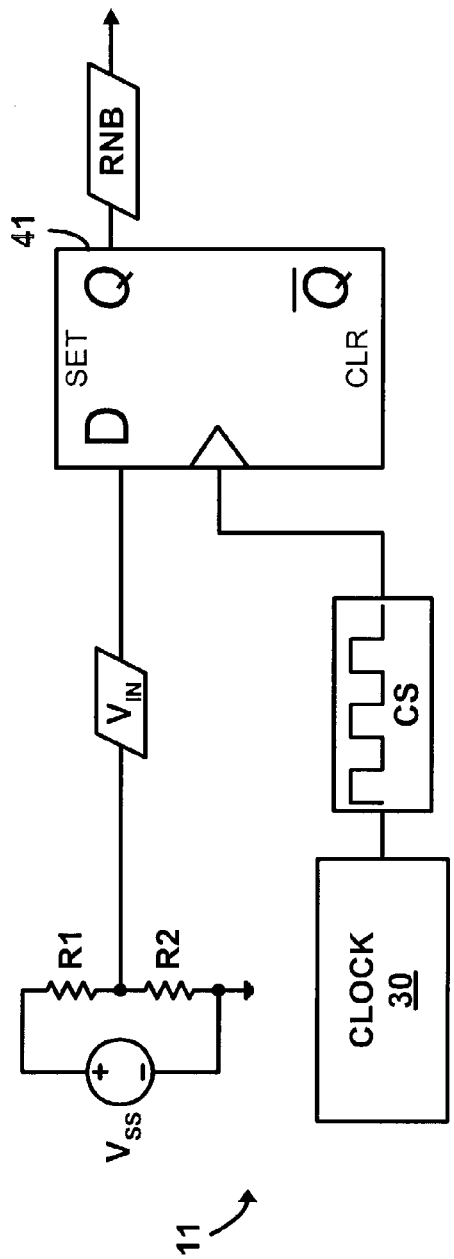
FIG. 3 illustrates a schematic diagram of a first embodiment of a physical random number generator in accordance with the present invention.

FIG. 3 illustrates a physical random number generator 11 (hereinafter "PRNG 11") as one embodiment of PRNG 10 (FIG. 1). The PRNG 11 comprises a bi-stable latch in the form of a D-type flip-flop 41 (hereinafter "flip-flop 41") having a data input D electrically coupled to a voltage source in the form of a resistor R1 and a resistor R2 configured as a voltage divider. The flip-flop 41 also has a clock input electrically coupled to the clock 30 as shown. The resistors R1 and R2 are electrically coupled to a supply voltage $V_{ss}$ to thereby generate voltage input signal $V_{IN}$. The resistive values of resistor R1 and R2 are selected to generate the voltage input signal $V_{IN}$ with a logic voltage level for provoking flip-flop 41 into a metastable state. Upon each triggering of the flip-flop 41 by the clock signal CS, the flip-flop 41 latches random number bit RNB at a data output Q as a function of its metastable state provoked by the voltage input signal $V_{IN}$. In an alternative embodiment of PRNG 11, a JK flip-flop can be employed in lieu of flip-flop 41.

Figure 4:
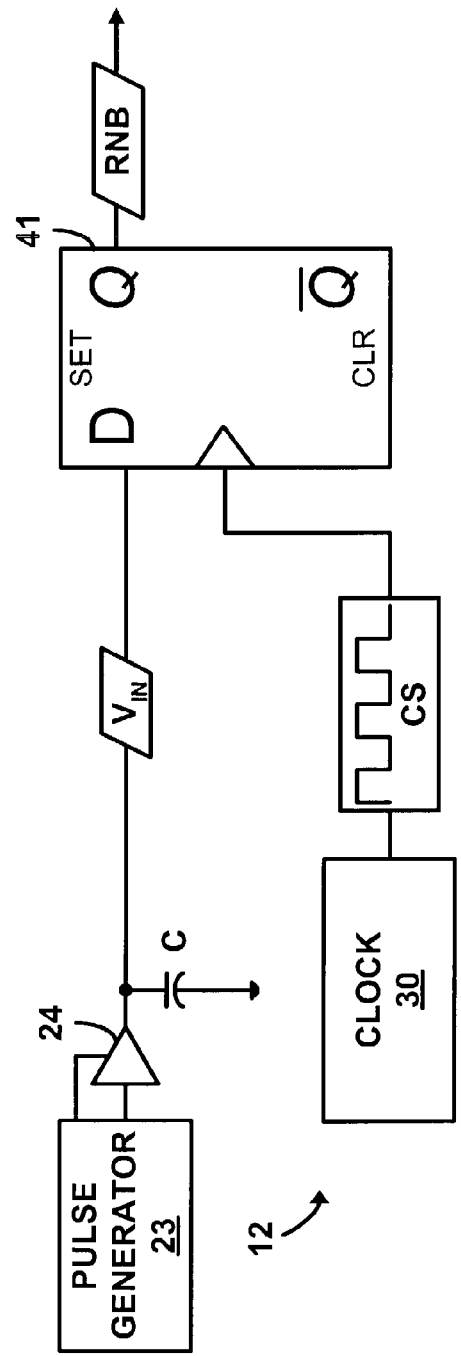
FIG. 4 illustrates a schematic diagram of a second embodiment of a physical random number generator in accordance with the present invention.

FIG. 4 illustrates a physical random number generator 12 (hereinafter "PRNG 12") as another embodiment of PRNG 10 (FIG. 1). The PRNG 12 comprises flip-flop 41 having the data input D electrically coupled to a voltage source in the form of capacitor C that is charged and discharged at a high switching frequency by a conventional pulse generator 21 and a tri-state gate 22. The high frequency charging and discharging of the capacitor C generates voltage input signal $V_{IN}$ with a logic voltage level for provoking the flip-flop 41 into a metastable state. Upon each triggering of the flip-flop 41 by the clock signal CS, the flip-flop 41 latches random number bit RNB at the data output Q as a function of its metastable state provoked by the voltage input signal $V_{IN}$. In an alternative embodiment of PRNG 12, a JK flip-flop can be employed in lieu if flip-flop 41.

FIG. 5 illustrates a physical random number generator 13 (hereinafter "PRNG 13") as another embodiment of PRNG 10 (FIG. 1). The PRNG 13 comprises flip-flop 41 having the data input D electrically coupled to a voltage source in the form of a CMOS transistor T1 and a CMOS transistor T2 for generating voltage input signal $V_{IN}$ with a logic voltage level for provoking the flip-flop 41 into a metastable state. Upon each triggering of the flip-flop 41 by the clock signal CS, the flip-flop 41 latches random number bit RNB at the data output Q as a function of its metastable state provoked by the voltage input signal $V_{IN}$. In an alternative embodiment of PRNG 13, a JK flip-flop can be employed in lieu if flip-flop 41.

FIG. 6 illustrates a physical random number generator 14 (hereinafter "PRNG 14") as another embodiment of PRNG 10 (FIG. 1). The PRNG 14 comprises flip-flop 41 having the data input D electrically coupled to NAND gate 26 for providing voltage input signal $V_{IN}$ to the flip-flop 41. At least one of the inputs of the NAND gate 25 is electrically coupled to an output of the NAND gate 25 to provide a negative DC feedback whereby voltage input signal $V_{IN}$ has a logic voltage level for provoking the flip-flop 41 into a metastable state. Upon each triggering of the flip-flop 41 by the clock signal CS, the flip-flop 41 latches random number bit RNB at the data output Q as a function of its metastable state provoked by the voltage input signal $V_{IN}$. In an alternative embodiment of PRNG 11, a JK flip-flop can be employed in lieu if flip-flop 41 and other logic circuit configurations can be employed in lieu of NAND gate 25.

Referring to FIGS. 3–6, in one embodiment, the clock signal CS is provided to the flip-flop 41b in a manner that honors a setup time and a hold time associated with a proper triggering of the flip-flop 41 as is well known in the art. To intensify the metastable state of the bi-stable latch (40) provoked by the voltage input signal $V_{IN}$, the clock signal CS can alternatively be provided to the flip-flop 41 in a manner that violates either the setup time and/or the hold time of the flip-flop 41, and/or the clock signal CS can alternatively be provided to have an influence the voltage input signal $V_{IN}$, such as, for example, via cross talk or a load change in the supply voltage.

Figure 7:
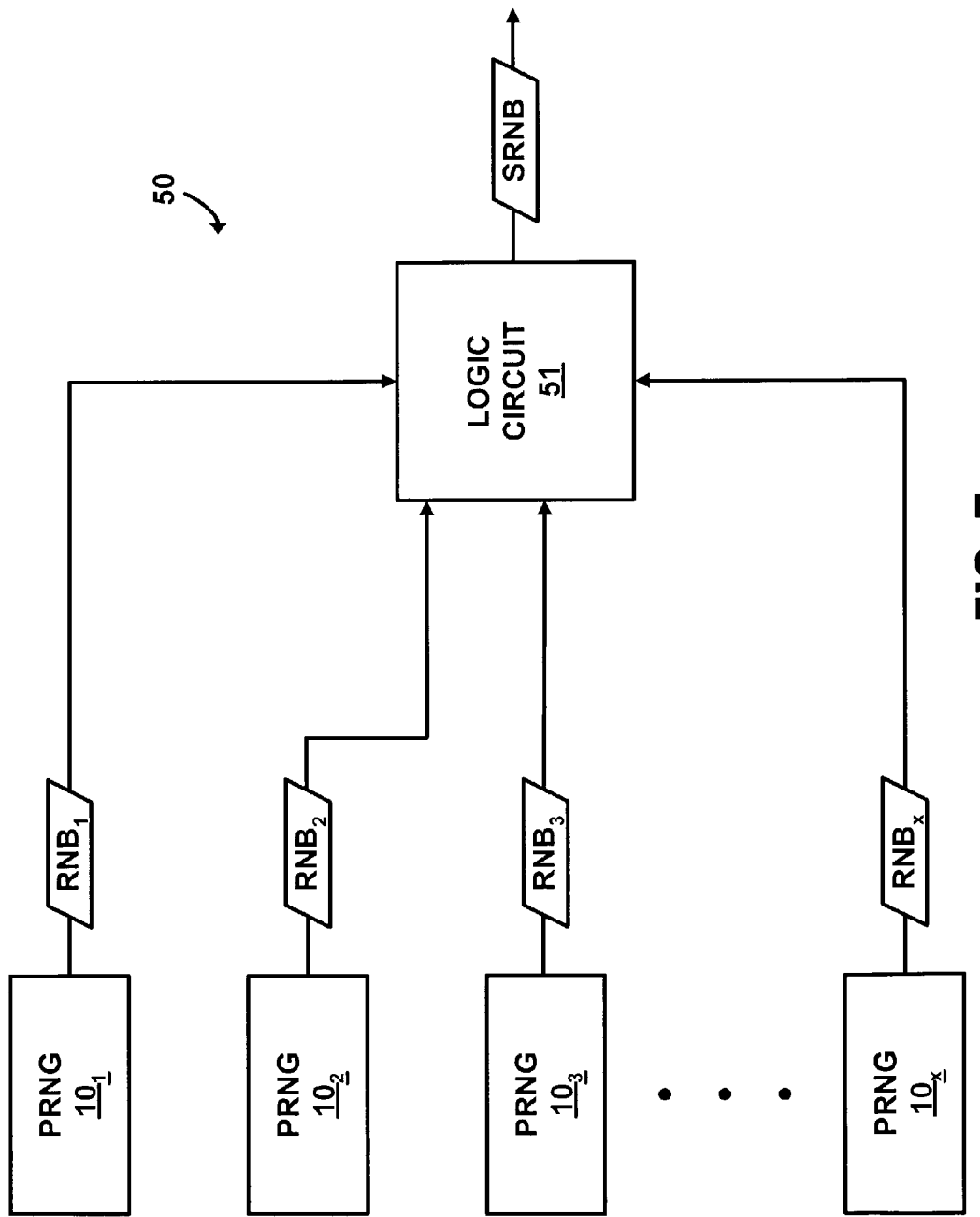
FIG. 7 illustrates a block diagram of a basic embodiment of a physical random number generation system in accordance with the present invention.

In practice, a PRNG 10 (FIG. 1) having an exactly matched temperature and supply voltage dependencies will rarely be achieved, if ever. Also, the manufacturing tolerances of the PRNG 10 can have imbalances whereby the PRNG 10 could generate the random number bit RNB as a zero significantly more often than producing the random number bit RNB as a one, or vice-versa. FIG. 7 illustrates a physical random number generating system 50 employing a plurality of PRNG $10_1$–$10_X$ electrically coupled to logic circuit 51 (e.g., a multi-input XOR gate) to thereby provide a plurality of random number bits $RNB_1$–$RNB_X$ to the logic circuit 51. In response thereto, the logic circuit 51 will provide a system random number bit SRNB that is sufficiently insensitive to any of the plurality of PRNG $10_1$–$10_X$ producing corresponding random number bits $RNB_1$–$RNB_X$ as a constant bit stream. As long as any one of the PRNG $10_1$–$10_X$ produces random bits, the resulting system random number bit SRNB will also be random. On a VLSI chip, integrating several hundreds of slightly different PRNG $10_X$ is feasible and the resulting bit stream will be highly unpredictable.

From the description of PRNG 10–13 and system 50, one skilled in the art will appreciate various benefits of the present invention. One benefit of the present invention is the facilitation of an easy implementation of a low power and relatively inexpensive physical random noise generator.

While the embodiments of the present invention disclosed herein are presently considered to be preferred, various changes and modifications can be made without departing from the spirit and scope of the present invention. The scope of the present invention is indicated in the appended claims, and all changes that come within the meaning and range of equivalents are intended to be embraced therein.

The invention claimed is:

1. A physical random number generator, comprising:
    a hi-stable latch;
    a voltage source operable to provide one or more voltage input signals for provoking said bi-stable latch into a metastable state wherein the voltage source includes a voltage divider to generate a first voltage input signal; and
    a clock operable to provide a clock signal for triggering said bi-stable latch,
        wherein said bi-stable latch is operable to latch a random number bit in response to a triggering of said bi-stable latch by the clock signal, the random number bit being a function of a provoking of said bi-stable latch into the metastable state by the one or more voltage input signals.

2. The physical random number generator of claim 1, wherein the clock signal intensifies the metastable state of said bi-stable latch.

3. The physical random number generator of claim 1, wherein said bi-stable latch is a flip-flop including
   a data input for receiving a first voltage input signal, and
   a clock input for receiving the clock signal.

4. A physical random number generating system, comprising:
   a plurality of random number generators operable to provide a plurality of random number bits;
   a logic circuit operable to provide a system random number bit in response to a reception of the plurality of random number bits; and
   wherein a first random number generator includes
      a bi-stable latch,
      a voltage source operable to provide one or more voltage input signals for provoking said bi-stable latch into a metastable state wherein the voltage source includes a voltage divider operable to generate a first voltage input signal, and
   a clock operable to provide a clock signal for triggering said bi-stable latch,
      wherein said bi-stable latch is operable to latch a first random number bit in response to a triggering of bi-stable latch by the clock signal, the number bit being a function of a provoking of said bi-stable latch into the metastable state by the one or more voltage input signals.

5. The physical random number generating system of claim 4, wherein the clock signal intensifies the metastable state of said bi-stable latch.

6. The physical random number generating system of claim 4, wherein said bi-stable latch is a flip-flop including
   a data input for receiving a first voltage input signal, and
   a clock input for receiving the clock signal.

7. A method of operating a bi-stable latch of a physical random number generator, said method comprising:
   receiving one or more voltage input signals for provoking the bi-stable latch into a metastable state wherein said voltage source includes a voltage divider operable to generate a first voltage input signal;
   receiving a clock signal for triggering the bi-stable latch; and
   latching a random number bit in response to triggering of the bi-stable latch, the random number bit being a function of a provoking of the bi-stable latch into the metastable state by the one or mare voltage input signals.

8. The method of claim 7, further comprising:
   providing the random number bit to a logic circuit whereby a system random number bit is generated as a function of the random number bit.

* * * * *